United States Patent
Perritt, Jr.

(10) Patent No.: US 12,476,584 B1
(45) Date of Patent: Nov. 18, 2025

(54) SOLAR ENERGY JACKET

(71) Applicant: Henry Hardy Perritt, Jr., Charlottesville, VA (US)

(72) Inventor: Henry Hardy Perritt, Jr., Charlottesville, VA (US)

( * ) Notice: Subject to any disclaimer, the term of this patent is extended or adjusted under 35 U.S.C. 154(b) by 0 days.

(21) Appl. No.: 19/069,577

(22) Filed: Mar. 4, 2025

(51) Int. Cl.
*H02S 30/20* (2014.01)
*A41D 1/00* (2018.01)
*H02J 7/35* (2006.01)
*H02S 20/30* (2014.01)
*H02S 40/38* (2014.01)
*H10K 30/40* (2023.01)
*H10K 39/38* (2023.01)
*H10K 77/10* (2023.01)

(52) U.S. Cl.
CPC ............. *H02S 30/20* (2014.12); *A41D 1/005* (2013.01); *H02J 7/35* (2013.01); *H02S 20/30* (2014.12); *H02S 40/38* (2014.12); *H10K 30/40* (2023.02); *H10K 39/38* (2023.02); *H10K 77/111* (2023.02)

(58) Field of Classification Search
CPC .......... H02S 30/20; H02S 20/30; H02S 40/38; A41D 1/005; H02J 7/35; H10K 30/40; H10K 39/38; H10K 77/111
See application file for complete search history.

(56) References Cited

U.S. PATENT DOCUMENTS

| | | | |
|---|---|---|---|
| 9,006,940 B2 | 4/2015 | Korman | |
| 9,515,522 B2 | 12/2016 | Cofta | |
| 10,388,898 B2 | 8/2019 | Xu | |
| 2005/0268962 A1* | 12/2005 | Gaudiana | H10K 39/601 438/74 |
| 2011/0054576 A1* | 3/2011 | Robinson | A61H 23/0263 607/108 |
| 2011/0290304 A1 | 12/2011 | Daniel | |
| 2013/0254969 A1* | 10/2013 | Getzen | A41D 1/02 2/108 |
| 2015/0122791 A1* | 5/2015 | Hung | A41D 13/005 219/494 |
| 2024/0258956 A1* | 8/2024 | Aida | H02S 30/20 |

FOREIGN PATENT DOCUMENTS

| | | | |
|---|---|---|---|
| CN | 204132441 U | * | 2/2015 |
| CN | 205757299 U | * | 12/2016 |
| CN | 206025276 U | | 3/2017 |

* cited by examiner

Primary Examiner — Michael Y Sun
(74) Attorney, Agent, or Firm — Henry H. Perritt, Jr.

(57) ABSTRACT

A solar jacket that functions as an article of clothing and a portable energy system is provided. The jacket includes detachable panels embedded with a plurality of solar cells, which are interconnected by wiring that can be configured in series or parallel according to the wearer's preference. The generated electricity is stored in an integrated battery that features a connector for supplying power to external devices. This innovative design offers a practical solution for on-the-go energy generation and usage while ensuring ease of maintenance and customization.

14 Claims, 10 Drawing Sheets

SOLAR ENERGY JACKET

CROSS-REFERENCE TO RELATED APPLICATIONS

Not applicable

STATEMENT REGARDING FEDERALLY SPONSORED RESEARCH OR DEVELOPMENT

Not applicable

THE NAMES OF THE PARTIES TO A JOINT RESEARCH AGREEMENT

Not applicable

INCORPORATION BY REFERENCE STATEMENT

Not applicable

STATEMENT REGARDING PRIOR DISCLOSURES BY THE INVENTOR OR A JOINT INVENTOR

Not applicable

REFERENCE TO A TABLE/PROGRAM LISTING/OTHER

Not applicable

BACKGROUND

Field of the Use

Wearable solar-cell panels

Background

The growing demand for renewable and portable energy solutions has spurred significant innovation in wearable technologies. Conventional clothing integrated with electronic functionalities typically focuses on communications, health monitoring, or environmental sensing. A need remains, however, for garments that not only incorporate electronic functions but also actively generate and store electricity for personal or portable device use. Prior art in wearable solar technology often involves fixed panel configurations that limit user customization, reduce comfort, or complicate garment maintenance.

Flexible solar cell technology is emerging as a transformative solution for wearable and portable energy applications, driven by the increasing demand for lightweight, sustainable, and integrated energy sources.

Thin-film inorganic materials are suitable for applications where higher efficiency is prioritized over cost. Materials such as amorphous silicon (a-Si), copper indium gallium selenide (CIGS), and cadmium telluride (CdTe) have been adapted for flexible substrates. These materials offer higher efficiencies than Organic Photovoltaics (OPVs), with flexible CIGS cells achieving efficiencies of 15-20%. Fabrication processes are often more complex, requiring precise control over deposition techniques.

Dye-Sensitized Solar Cells (DSSCs) use dye molecules to absorb light and generate electricity, offering flexibility and low-cost production. They can be produced using simple, scalable methods. Efficiencies are generally lower, ranging from 10-12%, and durability under mechanical stress needs improvement. Research has focused on enhancing flexibility and durability, making DSSCs increasingly viable for wearable applications.

The fabrication of flexible solar cells involves techniques that ensure compatibility with flexible substrates and textiles. These methods must balance performance, scalability, and cost-effectiveness. Key fabrication techniques include:

Roll-to-Roll (R2R) Processing enables continuous production of flexible solar cells on large-area substrates. It is cost-effective and scalable, making it suitable for mass production. It is commonly used for OPVs and thin-film inorganic cells, R2R processing is ideal for large-scale clothing integration.

Appropriate printing techniques allow for customization and seamless integration into textiles. Techniques such as inkjet printing, screen printing, and spray coating are used to deposit solar cell materials onto flexible substrates. These methods offer precision and the ability to create complex patterns, which is essential for integrating solar cells into clothing.

Low-Temperature Processing ensures compatibility with textile substrates, preserving their integrity. Many flexible substrates, such as plastics, cannot withstand high temperatures, necessitating low-temperature processing techniques. Solution-based methods for depositing perovskite layers allow processing at temperatures below 150° C.

Encapsulation ensures the longevity of solar cells in clothing applications. Flexible solar cells require robust encapsulation to protect them from environmental factors such as moisture, oxygen, and ultra-violet (UV) light. Flexible barrier films and advanced encapsulation materials have been developed to enhance durability.

The performance of flexible solar cells is evaluated based on several key metrics, which are crucial for determining their suitability for clothing applications:

Efficiency is important for wearable solar cells. Power conversion efficiency (PCE) measures the percentage of sunlight converted into usable electricity. PCEs range from 10% for OPVs to over 20% for PSCs and thin-film inorganic cells.

Wearable solar cells must be flexible and durable. Flexibility is assessed by bending radius, number of bending cycles, and stretchability. Some flexible solar cells can endure bending radii as small as 1 mm without significant performance loss and withstand thousands of bending cycles.

For clothing applications, solar cells must be lightweight and thin. Typical flexible solar cells have thicknesses of 100-500 micrometers and weigh less than 100 grams per square meter.

Stability refers to the ability to maintain performance under real-world conditions, including exposure to UV light, temperature fluctuations, and humidity. Recent advancements have led to flexible solar cells with operational lifetimes exceeding 1,000 hours under continuous illumination.

Integrating flexible solar cells into clothing presents unique challenges that must be addressed for practical and widespread adoption:

The choice of substrate ensures compatibility with both solar cell fabrication and textile properties. Polyethylene terephthalate (PET), polyethylene naphthalate (PEN), and flexible glass are commonly used. Substrates must balance flexibility, durability, and compatibility with fabrication processes.

Attaching solar cells to clothing requires methods that preserve the fabric's flexibility, breathability, and comfort. Zippers, Velcro, snaps, buttons, ties sewing, adhesive bonding, and weaving solar cells into the fabric are being explored. Ensuring seamless integration without compromising the textile's properties is a significant hurdle.

Efficiently managing the power generated by solar cells is crucial for wearable applications. Integration with flexible batteries or supercapacitors is advantageous to store and distribute energy. Matching power output to the energy requirements of wearable devices remains complex.

For consumer acceptance, solar cells must be aesthetically pleasing and seamlessly integrated into clothing. Developing cells with customizable colors, patterns, and transparency is desirable, but balancing aesthetics with performance and durability is a key design challenge.

Several innovations have pushed the boundaries of flexible solar cell technology, enhancing its suitability for clothing applications:

Tandem structures for solar cells combine materials such as perovskite and silicon to capture a broader spectrum of light. Flexible tandem solar cells have achieved efficiencies exceeding 25%. Higher efficiencies make tandem cells highly promising for wearable applications.

Self-healing materials enhance the practicality of solar-powered clothing. Research into self-healing polymers and encapsulates has shown promise in extending the lifespan of flexible solar cells. Minor damages can be repaired automatically, improving durability.

The state of the art in flexible solar cell technology for clothing applications is marked by significant advancements in materials science, fabrication techniques, and integration strategies. Materials such as OPVs, PSCs, thin-film inorganic cells, and DSSCs offer diverse options, each with unique advantages and challenges. Fabrication techniques like R2R processing, printing, and low-temperature methods enable scalable and compatible production, while robust encapsulation ensures durability. Performance metrics, including efficiency, flexibility, and stability, continue to improve, driven by innovations such as tandem cells, self-healing materials, and multi-source energy harvesting systems.

Despite these advancements, challenges remain in substrate compatibility, seamless textile integration, power management, and aesthetics. Addressing these hurdles is crucial for realizing the full potential of solar-powered clothing. Continued research and development are expected to further enhance the performance, practicality, and consumer acceptance of flexible solar cells, positioning them as a cornerstone for powering the next generation of wearable electronics.

REFERENCE TO A TABLE/PROGRAM LISTING/OTHER

Brief Summary

The disclosure and claims are directed to a solar jacket that functions as both a garment and a portable energy system. The jacket incorporates detachable panels embedded with a plurality of solar cells. These panels are fabricated from flexible materials that conform to the garment's shape while withstanding bending and environmental exposure. A plurality of wires interconnects the detachable panels. The wiring configuration is adaptable, enabling series or parallel connections at the wearer's discretion to optimize energy generation based on environmental conditions and to match the requirements of the battery to be charged. The system includes a battery connected to the solar panels. This battery is capable of storing the electricity generated during exposure to sunlight, ensuring that energy can be utilized when needed. The detachable panels feature multiple attachment points, such as zippers, Velcro, snaps, buttons, or ties, which allow secure yet easily removable installation on the jacket. The battery is equipped with a connector for transferring stored electricity to external electrical devices, such as cell phones or small heaters, thereby extending the functional utility of the garment.

This combination of features provides a versatile, energy-harvesting jacket that meets the modern needs of mobile power generation, personal convenience, and adaptability.

Terms and Definitions

DC is a common abbreviation for direct current.

Doffing signifies taking off, as in doffing or taking off a jacket.

Donning signifies putting on, as in donning or putting on a jacket.

A parallel configuration is an electrical circuit in which the positive terminal of one device in the circuit is connected to the positive terminal of a next device and the negative terminal of the one device is connected to the negative terminal of a preceding device.

A series configuration is an electrical circuit in which the positive terminal of one device in the circuit is connected to the negative terminal of a next device and the negative terminal of the one device is connected to the positive terminal of a preceding device.

USB is a common abbreviation for universal serial bus.

DETAILED DESCRIPTION

Overview

Figure 1:
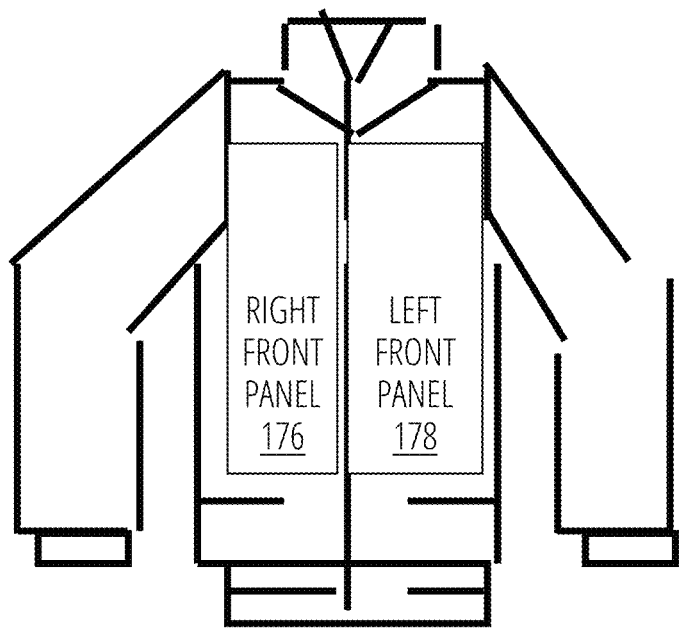
FIG. 1 depicts the front of the jacket.

The wearable solar energy system integrated into an into an upper body garment, such as a jacket—a "solar jacket"—is designed to integrate renewable energy generation seamlessly into everyday clothing. In one embodiment, the jacket comprises a base garment made from durable, weather-resistant fabric, with strategically placed compartments to house electronic components. The primary elements of the system are described below. To permit easy identification of any particular element or act, the most significant digit or digits in a reference number refer to the figure number in which that element is first introduced.

The system is capable of generating and storing sufficient electricity to charge a smartphone of a similar electronic device multiple times while the wearer is engaged in outdoor activities, thereby providing a portable and renewable power source Detachable Solar Panels The panels are constructed from flexible substrates in which high-efficiency solar cells are embedded. These substrates are designed to be both pliable and robust, allowing them to conform to the contours of the jacket without compromising the integrity of the solar cells. The detachable solar panels are constructed from lightweight, flexible materials that conform to the shape of the jacket and are resistant to environmental exposure, including water and dust.

Different embodiments use different materials for flexible solar cells. Flexible solar cells require materials that can endure mechanical stresses such as bending, stretching, and twisting while maintaining high photovoltaic efficiency. The choice of materials influences performance and compatibility with clothing applications.

One embodiment uses Organic Photovoltaic (OPV) Materials. OPVs are made from carbon-based compounds, offering inherent flexibility and lightweight properties. They are cost-effective to produce and suitable for large-scale manufacturing. OPVs generally exhibit lower efficiencies, however, typically around 10%, compared to inorganic counterparts. Advances in material stability and efficiency have pushed some OPV cells to efficiencies exceeding 10%, making them viable for wearable applications.

Another embodiment uses Perovskite Solar Cells (PSCs). Perovskites are a class of materials with high efficiency and the ability to be processed at low temperatures, making them ideal for flexible substrates. Flexible PSCs have demonstrated efficiencies exceeding 20%, rivaling traditional silicon-based cells. Their high efficiency and adaptability make PSCs a promising option for clothing-integrated solar cells.

In selecting the most suitable photovoltaic technology for the solar jacket, various factors such as flexibility, efficiency, durability, and environmental impact must be balanced. Organic Photovoltaics (OPV) offer superior mechanical flexibility and light weight properties, making them highly compatible with wearable applications; they generally exhibit lower power conversion efficiencies, however, and may suffer from a shorter operational lifespan under outdoor conditions. In contrast, Perovskite Solar Cells (PSC) have demonstrated rapid improvements in efficiency and can also be engineered on flexible substrates, though concerns remain regarding their long-term stability and the potential environmental risks associated with lead content. Alternatively, thin-film amorphous silicon presents a middle ground, combining a moderate efficiency with proven durability and established manufacturing processes. Ultimately, the choice between OPV, PSC, or another technology will depend on the specific performance targets and environmental conditions envisioned for the solar jacket, aiming to optimize the trade-offs between energy generation, mechanical resilience, and long-term reliability.

One embodiment employs Perovskite Solar Cells (PSC) for achieving the greatest charging capacity in the field. PSCs are capable of high power conversion efficiencies—often surpassing 20%—which is advantageous for maximizing energy harvest from the limited surface area available on wearable devices. This efficiency advantage translates directly to a higher charging capacity under real-world sunlight conditions, even when panel orientation and environmental factors vary. Furthermore, recent advancements in flexible PSC fabrication allow these cells to be integrated into the solar jacket without compromising comfort or durability. While PSCs have faced challenges with long-term stability, modern encapsulation techniques have significantly improved their resilience against environmental degradation, making them a viable and attractive option for delivering optimal performance in portable energy-harvesting applications.

Each panel includes integrated attachment points that enable secure fixation to the garment. These points can be realized through various means, including a group comprising zippers, Velcro strips, snaps, buttons, or ties. Such versatility ensures that the panels can be easily attached or detached, facilitating garment maintenance (e.g., washing) and allowing the wearer to customize the panel arrangement.

Configurable Wiring System with User Control

A network of wires interconnects the detachable panels. routed through the jacket's lining to protect the wires and maintain the aesthetic appearance. Network flexibility allows the wearer to adapt the configuration for optimal performance based on factors such as light intensity and desired voltage/current output.

The wiring system is designed with user-configurable connections, permitting adjustments without requiring specialized tools or technical knowledge.

In one embodiment, a voltage matching circuit is incorporated between the solar panels and the LiPo battery to ensure that the voltage output from the panels is precisely aligned with the battery's charging requirements. This circuit may include a DC-to-DC converter, such as a buck or boost converter, to step down or up the voltage as appropriate, thereby compensating for any discrepancies between the solar panels' natural voltage output and the optimal charging voltage of the LiPo battery. In addition, the system may employ maximum power point tracking (MPPT) to adjust the voltage and current from the solar panels dynamically, optimizing energy transfer and ensuring efficient battery charging under varying sunlight conditions. This voltage regulation strategy not only safeguards the battery from potential overvoltage or undervoltage conditions but also maximizes the overall efficiency and reliability of the energy harvesting system.

The battery comprises a connector for passing electricity from the battery to electrical devices such as cell phones or small heaters.

In one embodiment, the system allows the user to elect between series and parallel configurations for the three solar panels to match the voltage and current output effectively to the LiPo battery's charging requirements. When the panels are connected in series, their individual voltages combine to produce a higher overall voltage, which can be crucial when the charging circuit requires an input voltage that exceeds that of a single panel. Conversely, a parallel configuration maintains the same voltage level as one panel while summing the available current, which is beneficial when a higher current is needed for efficient charging. This selectable configuration provides flexibility to optimize the energy transfer, ensuring that the power output from the solar panels is tailored to the specific charging needs of the battery under varying environmental conditions.

In one embodiment, the solar jacket is further configured to provide a regulated voltage output that meets the requirements for charging electronic devices via USB Type C connectors. Typically, a nominal output of 5 volts is maintained to ensure compatibility with the majority of cellphones and similar devices. This regulated 5V output is achieved through a voltage regulation circuit that conditions the battery's variable output to a stable level, even as the battery discharges. Moreover, in embodiments supporting higher power demands, the system can incorporate USB Power Delivery protocols to negotiate and deliver elevated voltages—such as 9V, 12V, or even 20V—while maintaining safe charging currents. This adaptability in voltage regulation not only ensures reliable charging under diverse conditions but also broadens the range of electronic devices that can be efficiently powered by the solar jacket.

In one embodiment, the design can be streamlined by dispensing with a separate jacket battery and instead charging the battery within an electronic device—such as a cellphone—directly from the solar panels. In this configuration, a dedicated USB Type C connector is provided on the output switch of the solar panels, which routes the harvested energy directly to the device. Integrated voltage regulation circuitry ensures that the output is stabilized and maintained within the appropriate range for safe and efficient charging. This approach not only reduces the overall component count and weight of the system but also enhances energy efficiency by eliminating the losses typically associated with intermediate storage, while maintaining compatibility with modern electronic devices through the universal USB Type C standard.

Battery Integration

The jacket includes a battery integrated into a discreet pocket or compartment within the garment, a "jacket battery." The battery is housed within a dedicated pouch of the jacket. This battery is electrically connected to the solar panels and stores the energy generated during sunlight exposure.

In one exemplary embodiment, the solar panels are configured to charge a lithium-polymer (LiPo) battery through a balanced charger circuit. The balanced charger monitors the voltage level of each individual cell within the LiPo pack, ensuring that all cells remain within safe operating limits. Specifically, the charger includes a control circuit or microcontroller that measures each cell's voltage and regulates the current flowing from the solar panels, preventing overcharging or undercharging. By distributing charge evenly across all cells, this balanced approach maximizes battery performance and extends overall battery life. The system may also include indicators or a user interface to provide real-time information about the battery's state of charge, thereby enhancing the safety and reliability of the solar-powered garment.

The battery features an external connector port that facilitates the transfer of stored electricity to external devices, a USB Type C connector in some embodiments. For instance, a wearer may connect a cell phone, small heater, or other portable electronic device to access power, thereby enhancing the jacket's practicality in various scenarios.

A USB Type C connector is particularly well-suited for this application due to its universal adoption across a wide range of modern cellphones and electronic devices, ensuring broad compatibility and user convenience. Its reversible design not only simplifies connection orientation, but also enhances durability by minimizing wear from incorrect insertions. Additionally, USB Type C supports higher power delivery and fast charging standards, enabling efficient energy transfer from the solar jacket's regulated output to various devices. This connector's ability to handle both power and data further extends its utility, making it an ideal interface for a multifunctional wearable energy solution that aligns with contemporary technology trends and user expectations.

System Operation

When the solar panels are exposed to sunlight, the embedded solar cells convert solar energy into electrical energy. This energy is then directed through the configurable wiring to the battery, where it is stored for later use.

The detachable design of the panels not only simplifies maintenance but also allows for modularity. Users can potentially replace or upgrade individual panels or reconfigure the garment to match different activity requirements or weather conditions.

The system is capable of generating and storing sufficient electricity to charge a smartphone multiple times while the wearer is engaged in outdoor activities, thereby providing a portable and renewable power source.

Under ordinary sunlight, the flexible PSC solar panels on the jacket are estimated to deliver a combined peak output of roughly 20 to 25 watts. In a series configuration, the panels might generate a higher voltage—on the order of 12 to 15 volts—while yielding a current of approximately 1.5 to 2.0 amperes, plus or minus 1.0 ampere. Alternatively, when connected in parallel, the voltage may drop to around 6 to 7 volts, but the current output increases, potentially reaching 3 to 4 amperes. These figures take into account the total active area of about 0.28 square meters and a realistic operational efficiency for PSCs under typical sunlight conditions. Such flexibility in configuring the solar panels helps optimize the electrical parameters for charging a LiPo battery by matching the voltage and current to the requirements of the onboard charging circuitry.

When this harvested energy is stored in a LiPo battery—assumed here to have a capacity of around 11 watt-hours—it translates directly into extended cellphone usage. For instance, under optimal sunlight conditions delivering an average of 20 watts, the LiPo battery could be recharged in approximately 30 to 40 minutes, plus or minus 20 minutes. Once charged, and considering that a typical cellphone draws about 5 watts during standard operation, the battery could potentially support 2 to 3 hours of active use or provide multiple partial charges over the course of a day. This efficient energy conversion and storage system ensures that users have access to a reliable power source for their mobile devices, even in conditions where direct sunlight may not be continuously available.

Additional Considerations

The electrical components are encapsulated within protective layers to shield them from environmental factors such as moisture, dust, and mechanical stress.

While functionality is paramount, the design of the solar jacket also considers aesthetic appeal, ensuring that the integration of technology does not detract from the garment's appearance.

The jacket comprises a front with two flaps connected by a closure 488, a back, side seams and shoulder seams connecting the front flaps to the back, and sleeve seams connecting the sleeves to the front flaps and the back.

FIG. 1 shows the front of the jacket with the left front panel 178 and right front panel 176 installed.

Figure 2:
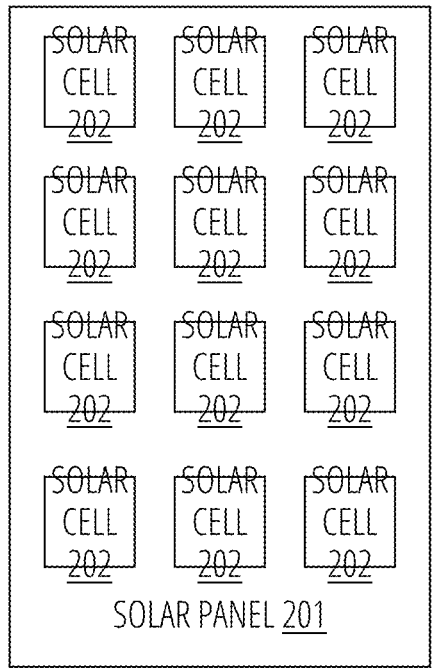
FIG. 2 depicts a solar panel with its individual solar cells

FIG. 2 shows a solar panel, exemplifying the left front panel 178, the right front panel 176, and the rear panel 903 with a plurality of solar cells 202 embedded in the panel.

Figure 3:
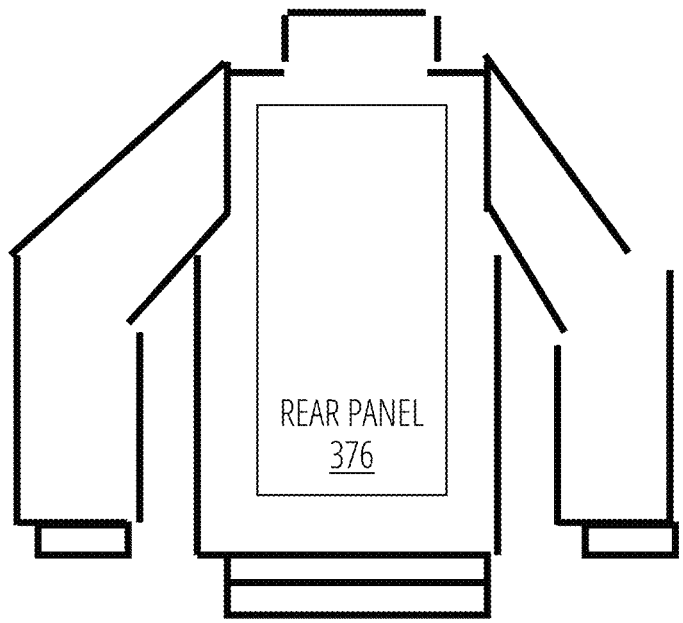
FIG. 3 depicts the back of the jacket.

FIG. 3 shows the back of the back with the rear panel 376 installed.

Figure 4:
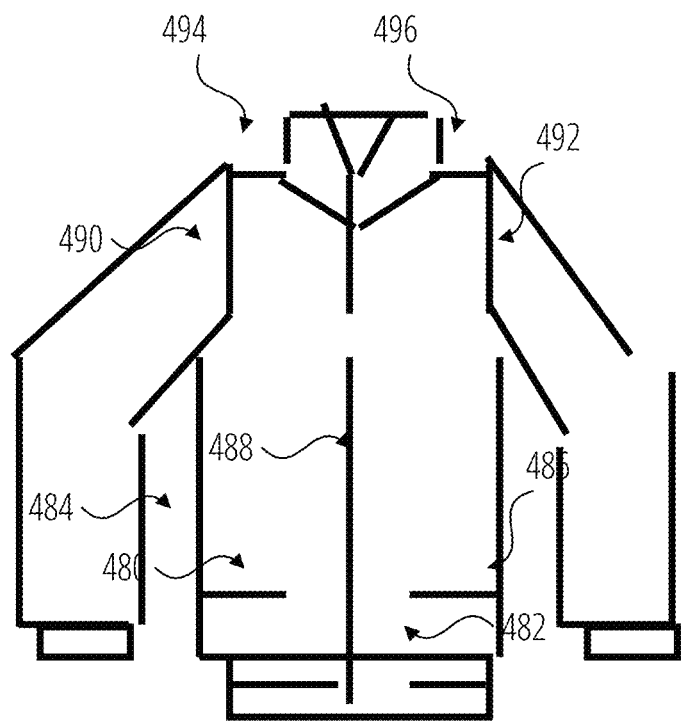
FIG. 4 depicts the front of the jacket.

FIG. 4 shows the front of the jacket with the left side seam 486, the right side seam 484, the left sleeve seam 492, the right sleeve seam 490, the closure 488, the left sleeve seam 492, the right shoulder seam 494, and the and the left shoulder seam 496 depicted.

Figure 5:
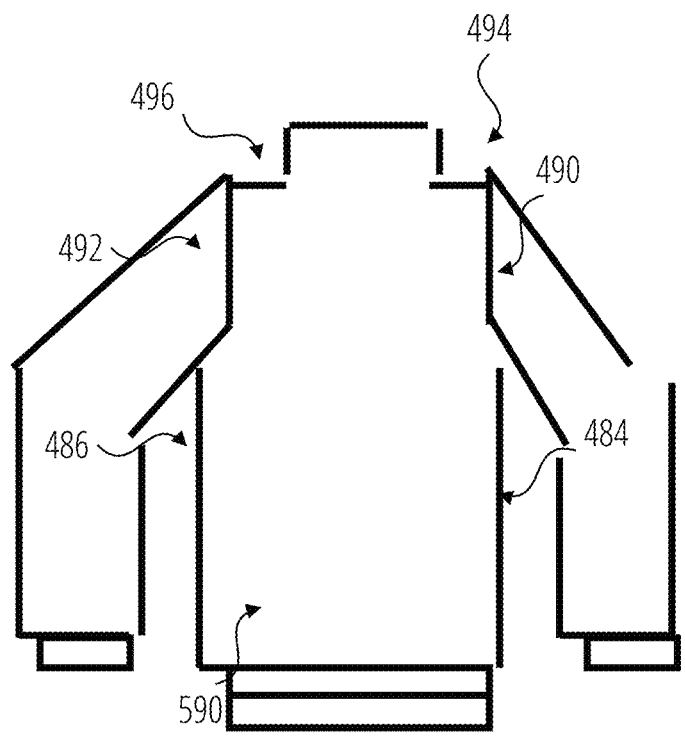
FIG. 5 depicts the back of the jacket.

FIG. 5 shows the back 590 of the jacket with the left side seam 486, the right side seam 484, the left sleeve seam 492, the right sleeve seam 490 586, the left shoulder seam 496, and the right shoulder seam 494 depicted.

Can be Laid Flat

In one embodiment, the jacket features side-seam zippers along the arm regions and additional zippers on the sleeves, allowing the wearer to remove the sleeves easily. By unzipping the side-seam zippers, the sleeves are detached from the main body of the jacket, and the sleeve zippers enable complete removal of the sleeve fabric. This design facilitates reconfiguring the jacket so that the front and back sections— each incorporating solar panels—can be laid completely flat on a surface. Laying the panels flat maximizes their exposure to sunlight, thereby optimizing energy capture and charging efficiency even when the jacket is not being worn. In this configuration, the solar panels continue to charge the integrated battery at high efficiency even when the garment whom is not being worn.

Figure 6:
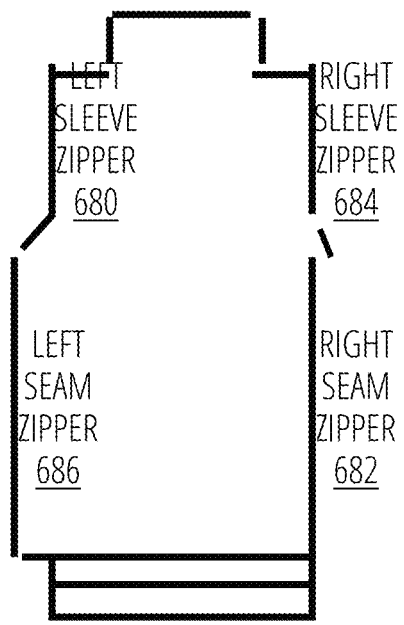
FIG. 6 depicts the location of the side zippers and sleeve zippers.

FIG. 6 shows the positions of the left sleeve zipper 680, the right sleeve zipper 684, the left seam zipper 686, and the right seam zipper 682 viewed from the rear of the jacket.

Figure 7:
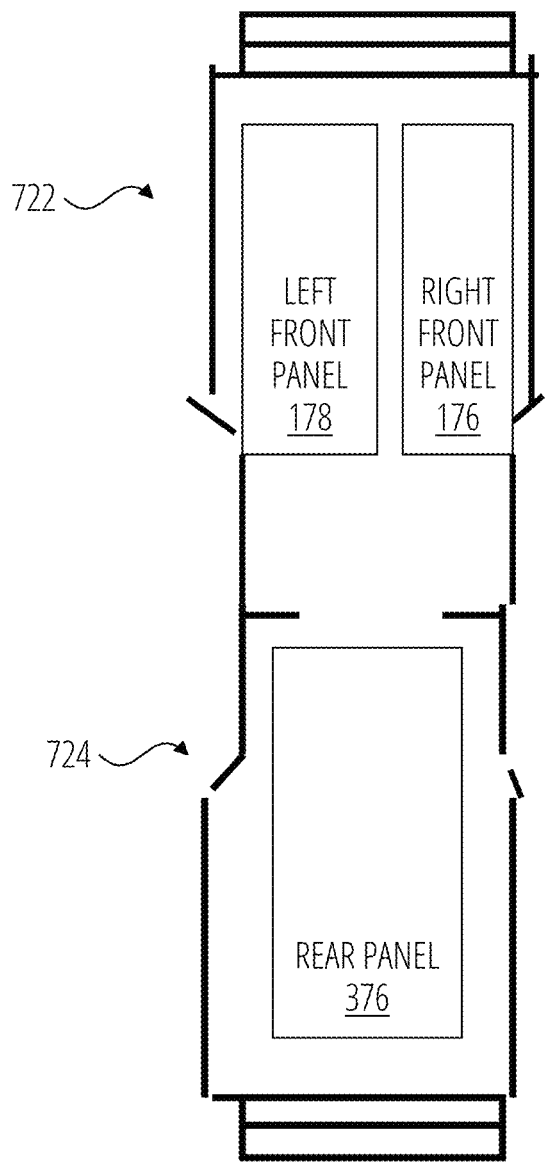
FIG. 7 depicts the front and back of the jacket laid flat, with the zippers and sleeves removed.
Figure 8:
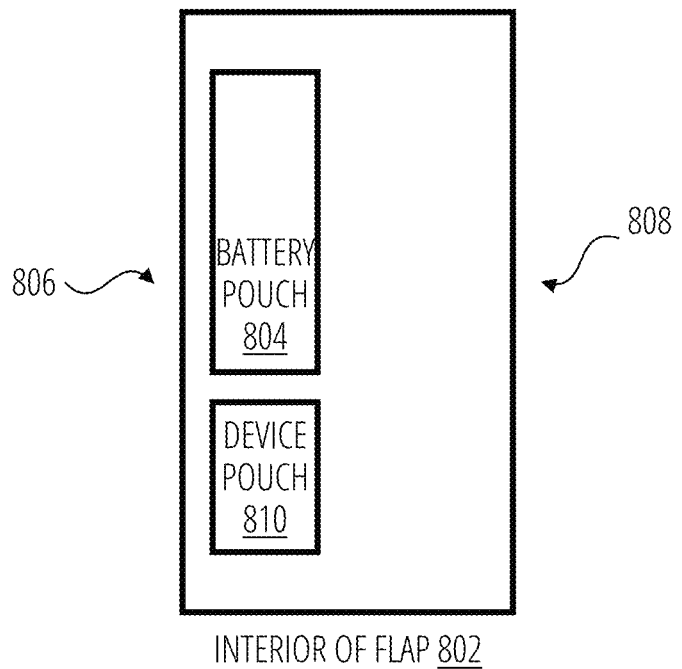
FIG. 8 depicts the location of the pouches containing the battery and the electronic device.

FIG. 7 shows the front of the jacket 522 and the back of the jacket 724 laid flat after the zippers have been unzipped, with the left front panel 178, the right front panel 176, and the rear panel 376 upward, exposed to sunlight. The left sleeve seam 492 and the right sleeve seam 490 continue to attach the back 590 to the left flap 482 and the back 590 to right flap 480 when the jacket is laid flat.

Allowing the detachable panels to be arranged flat on a surface when the garment is not being worn maximizes the panels' exposure to sunlight, thereby enhancing their energy harvesting efficiency and allows charging to continue unabated. By enabling the jacket to function both as a wearable energy generator and as a stationary solar charging station, users benefit from increased flexibility and convenience, ensuring that the battery remains charged even during periods of inactivity. This dual functionality not only optimizes energy collection but also extends the utility of the solar jacket as an always-ready portable power source.

The battery is contained in a battery pouch 804 affixed to the interior of a flap 802 of the jacket, oriented proximate to the front 806 of the jacket rather than the back 808, making it convenient to a user. The electronic device to be charged is contained in a device pouch 810 affixed to interior of flap of the jacket 802. The battery pouch 804 and the device pouch 810 may be on the same flap or on opposite flaps of the jacket.

Figure 9:
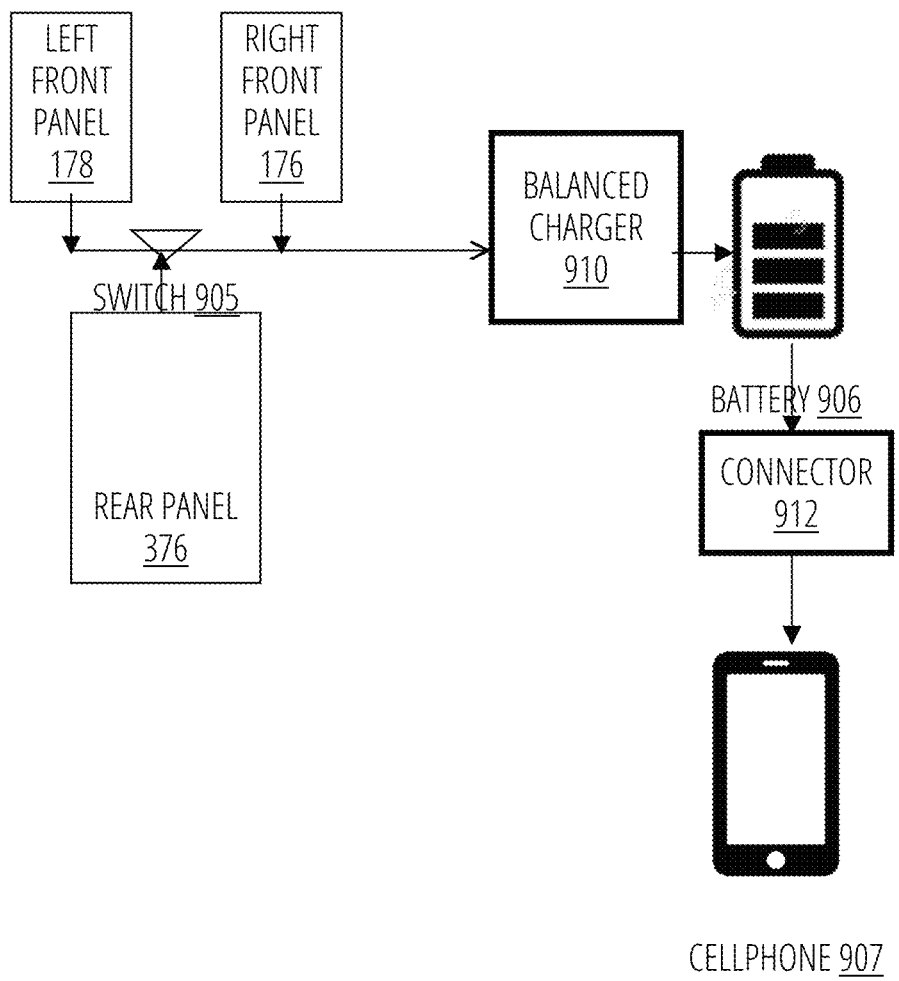
FIG. 9 depicts the connections among the solar cells, the switch, the battery, and the electronics device.

FIG. 9 shows the basic wiring configuration of the jacket, with the left front panel 178, the right front panel 176, and the rear panel 376 interconnected through a switch 905 and a balanced charger 910 to a battery 906 with can be connected to a cellphone 907 or another electrical device via a connector 912.

Figure 10:
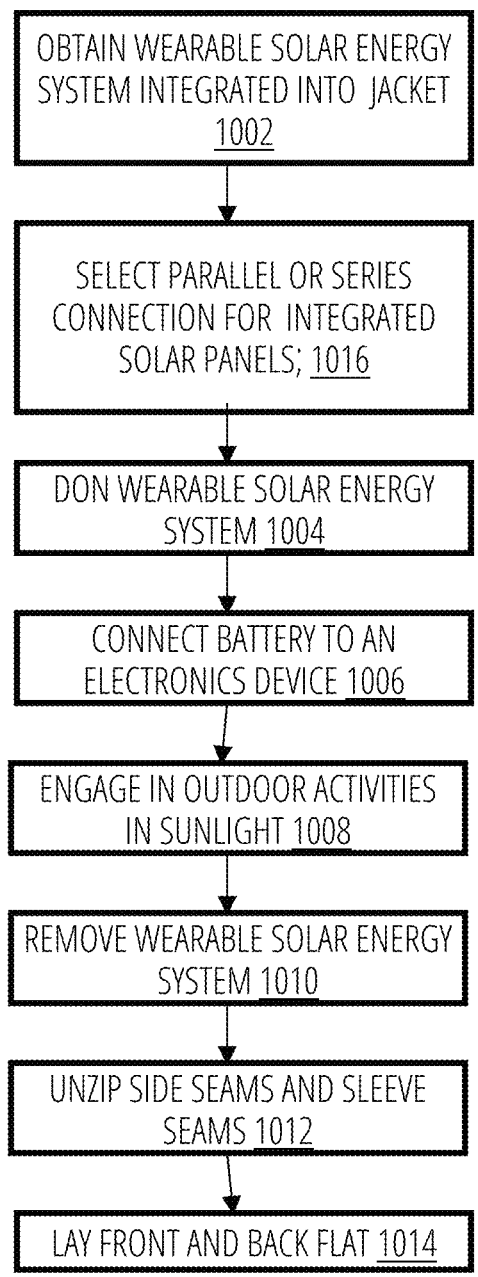
FIG. 10 illustrates the steps in using the system.

FIG. 10 shows how the system is used for recharging electronics devices while the user is engaged in outdoor activities, comprising:

obtaining a wearable solar energy system integrated into a jacket, comprising for recharging electronics devices while engaged in outdoor activities. A user obtains a wearable solar energy system integrated into jacket 1002, selects a parallel or series connection for the integrated solar panels 1016, dons the wearable solar energy system 1004, and engages in outdoor activities, such as running, hiking, bicycling, skiing, sailing, birdwatching, or working in sunlight 1008. When the user has completed the outdoor activity, the user removes wearable solar energy system 1010, unzips side seams and sholder seams 1012, and lays front and back flat 1014, with the solar panels upward, facing the sun.

The system represents a unique and non-obvious integration of apparel and electronic components, each of which has traditionally been used separately. While flexible solar panels, battery charging circuits, and wearable fabrics are individually known in the art, their synergistic combination into a single, multifunctional garment is not taught or suggested by prior references. By incorporating detachable, flexible solar panels that can be reconfigured, a selectable series/parallel wiring system, and options for either intermediate battery storage or direct device charging via a USB Type C connector, the system creates a novel solution that enhances energy harvesting, user convenience, and product versatility. This inventive convergence transforms ordinary clothing into a portable, efficient energy system, yielding benefits that exceed the sum of its individual parts.

I claim:

1. A wearable solar energy system integrated into an upper body garment, comprising:
   a plurality of detachable solar panels, each panel of the plurality of detachable solar panels comprising flexible materials embedded with solar cells and attachment points selected from the group consisting of zippers, Velcro material, snaps, buttons, or ties for securing to the upper body garment;
   a configurable wiring system interconnecting the detachable solar panels, wherein the configurable wiring system includes user-accessible connection points that allows a wearer to control and reconfigure solar panel configurations actively to optimize energy generation based on environmental conditions including changes in lighting conditions, partial shading, or specific power requirements;
   an integrated battery electrically connected to the configurable wiring system by a balanced charge controller for storing electrical energy generated by the solar panels; and
   a connector on the battery for transferring the stored electricity to electrical devices;
   the upper body garment configured to accept the detachable solar panels.

2. The wearable solar energy system of claim 1, wherein the upper body garment comprises a jacket.

3. The wearable solar energy system of claim 1, wherein the configurable wiring system includes the user-accessible connection points or switches that enable the wearer to select manually between series and parallel configurations.

4. The wearable solar energy system of claim 1, wherein the battery is housed within a dedicated pouch of the upper body garment, and the configurable wiring system is routed to protect wires and to maintain an aesthetic appearance of the garment.

5. The wearable solar energy system of claim 1, wherein the detachable solar panels are constructed from lightweight, flexible materials that conform to a shape of the upper body garment and are resistant to environmental exposure, including water and dust.

6. The wearable solar energy system of claim 1, wherein the system is capable of generating and storing sufficient electricity to charge a smartphone multiple times while the wearer is engaged in outdoor activities, thereby providing a portable and renewable power source.

7. The wearable solar energy system of claim 1, wherein side seams and sleeve seams comprise zippers configured to allow the upper body garment to be opened up and laid flat to allow continued charging of the solar cells when the upper body garment is not being warn.

8. The wearable solar energy system of claim 1, wherein the battery comprises:
  a lithium polymer battery comprising a plurality of cells;
  use of maximum power point tracking to adjust voltage and current from the solar panels dynamically, optimizing energy transfer and safeguarding the battery from potential overvoltage or undervoltage conditions; and
  a balanced charger circuit configured to monitor a voltage level of each of the plurality of cells within the battery, ensuring that all the plurality of cells remain within safe operating limits.

9. The wearable solar energy system of claim 1, wherein an output voltage of the battery is five volts direct current (DC).

10. The wearable solar energy system of claim 1, wherein the battery has a jack for accepting USB Type C connectors.

11. The wearable solar energy system of claim 1, wherein the solar panels comprise Perovskite Solar Cells (PSC).

12. The wearable solar energy system of claim 1, wherein the solar panels have a substrate comprising polyethylene terephthalate (PET).

13. The wearable solar energy system of claim 1, wherein the solar panels have a substrate comprising polyethylene naphthalate (PEN).

14. The wearable solar energy system of claim 1, wherein side seams and sleeve seams comprise Velcro material configured to allow the upper body garment to be opened up and laid flat to allow continued charging of the solar cells when the upper body garment is not being warn.

* * * * *